United States Patent [19]
Kitano et al.

[11] Patent Number: 5,608,265
[45] Date of Patent: Mar. 4, 1997

[54] ENCAPSULATED SEMICONDUCTOR DEVICE PACKAGE HAVING HOLES FOR ELECTRICALLY CONDUCTIVE MATERIAL

[75] Inventors: Makoto Kitano, Tsuchiura; Asao Nishimura, Ushiku; Akihiro Yaguchi, Ibaraki-ken; Nae Yoneda, Ibaraki-ken; Ryuji Kohno, Ibaraki-ken; Naotaka Tanaka, Ibaraki-ken; Tetsuo Kumazawa, Ibaraki-ken, all of Japan

[73] Assignee: Hitachi, Ltd., Tokyo, Japan

[21] Appl. No.: 207,697

[22] Filed: Mar. 9, 1994

[30] Foreign Application Priority Data

Mar. 17, 1993 [JP] Japan .................................. 5-056805

[51] Int. Cl.⁶ ..................... H01L 23/48; H01L 23/02; H01L 29/40
[52] U.S. Cl. .................... 257/738; 257/685; 257/686; 257/774; 257/737
[58] Field of Search ........................ 257/666, 676, 257/685, 686, 737, 738, 774, 780, 787

[56] References Cited

U.S. PATENT DOCUMENTS 5,045,914  9/1991  Castro et al. .......................... 257/686
5,045,921  9/1991  Lin et al. ............................... 257/780

FOREIGN PATENT DOCUMENTS 61-73353  4/1986  Japan ..................................... 257/787

Primary Examiner—Carl Whitehead, Jr.
Attorney, Agent, or Firm—Antonelli, Terry, Stout & Kraus, LLP

[57] ABSTRACT

A semiconductor device, provided in a plastic encapsulated package, having a semiconductor chip, a lead and a member for electrically connecting them together. The semiconductor device has one or more first holes respectively extending from one surface of the package to a first side of the lead which is provided inside of the package, and has one or more second holes formed which are aligned with the first holes, respectively, in a manner such that each second hole is extended from the opposing surface of the package to a corresponding location on a second side of the lead and is aligned with a corresponding, opposing first hole, in the package, extending to the first side of the lead. These holes are provided as a plurality of sets of individual pairs of aligned holes respectively extending inwardly, from opposing surfaces of the package, to opposite sides of the corresponding leads. In the device the leads or the leads with resin act as partitions thereby effecting isolation between the first and second holes of each pair aligned holes.

54 Claims, 10 Drawing Sheets

ENCAPSULATED SEMICONDUCTOR DEVICE PACKAGE HAVING HOLES FOR ELECTRICALLY CONDUCTIVE MATERIAL

BACKGROUND OF THE INVENTION

1. Field of the Invention

This invention relates to a semiconductor device and a method of producing the same, and a lead frame and a mounting board therefor. More particularly, it relates to a plastic-molded-type semiconductor device suitable for high-density packaging and a method of producing the same, as well as a mounting board which is a printed circuit board for mounting such a device, a semiconductor device including semiconductor device packages combined with each other, and a lead frame used in a semiconductor device.

2. Description of the Related Art

The conventional package of a semiconductor device has mainly been a package in which leads are arranged in its sides. This package has an advantage that it is low in the production cost, but has a disadvantage arising from the fact that the leads are arranged one-dimensionally. Since the number of leads is in proportion to the package size, there has been the disadvantage that a size of the package must be made larger as the number of leads is increased, so that the high-density mounting performed by way of multi-pins has been limited.

As a package which is suitable in achievement of multi-pins in order to overcome the above disadvantage, a pin-grid-array type semiconductor device has been put to practical use. This package is provided with two-dimensionally arranged pins of a lattice configuration on the underside of the package to achieve multi-pins.

However, this package necessitates the machining of through-holes in a printed circuit board to be mounted which adds to the cost in the production thereof. It has also the disadvantage that it requires a fine pin pitch.

In a further development thereof, a structure has been proposed in which electrodes are two-dimensionally arranged on the package surface that can be directly soldered onto a printed circuit board. Such developments have been disclosed in Japanese Patent Unexamined Publication Nos. 62-147751, 1-105566, 1-244655 and 3-94459, etc.

Of the afore-mentioned prior techniques, the package disclosed in Japanese Patent Unexamined Publication No. 62-147751 makes use of a small hole which is bored from the lower surface of a plastic-molded encapsulated package to the lower side of a lead. This package has a structure that outer electro-conductive connection is achieved by filling a solder in the small hole, and this structure appears to have the most materiality.

In the afore-mentioned prior arts, a concrete structure including a method of connecting a semiconductor chip to electrodes on the package surface has not been studied, and hence none has been put to practical use.

In an example described in Japanese Patent Unexamined Publication No. 62-147751, it is not studied how to form a small hole, especially a method suitable for mass production and further the technique of connecting the leads to a solder are not studied therein.

SUMMARY OF THE INVENTION

The present invention overcomes the drawbacks of these conventional techniques, and it is an object of the present invention to provide a structure of a multi-pin package and a method of producing the same package thereby enabling a mass production thereof and realizing a low production cost as well as achieving excellent reliability.

The above-mentioned object is attained by providing a pair of holes which are vertically aligned and extending from an upper surface of a package and an opposing lower surface thereof to respectively predetermined positions of each inner lead of a plastic-molded-type semiconductor package.

A semiconductor device according to the present invention includes a semiconductor chip, a lead frame and means for electrically connecting them to each other and is of the type in which a package is formed by encapsulating them with a plastic, having any of the following constructions:

(1) The package has first holes formed each of which is extended from one surface of the package to a first side of a corresponding lead provided inside the package and further has second holes formed which are aligned with said first holes, respectively, in a manner such that each second hole is extended from the opposite surface of the package to an opposing second side of the lead at a position thereof aligned with a corresponding opposing, first hole at the said one surface of the package to the first side of the lead; these holes are provided as individual pairs of holes and further as a plurality of sets including such pairs.

(2) The package has holes formed extending from at least one surface of the package to a side of a lead provided inside of the package, respectively, in which the opening of each hole has an area which becomes increasingly tapered in the direction towards the inside of the package.

(3) The package has leads which do not project outside of a package and one or more electrically conductive member having one end connected to one or more inner lead at a plurality of positions and the other end projecting on a surface of the package through an encapsulating plastic, thereby forming a gap between the periphery of the electrically conductive member and the plastic.

(4) The package has a plurality of penetration holes provided from one surface thereof to the opposite surface thereof, each hole being interrupted by a lead inside of a package.

(5) In the above construction (1), one or more bump made of an electrically conductive material and connected to one or more lead is provided inside one or more hole with respect to a part or all of the holes.

(6) In the above construction (5), the bump of an electrically conductive material is projected outwardly from the package surface.

(7) In the above construction (1), opening of each hole at the package surface has an area greater than the opening thereof at the lead surface.

(8) In the above construction (1), the opening of each hole is tapered inwardly, that is, it becomes increasingly narrowed in the direction towards the inside of the package.

(9) In the above construction (1), the inner periphery of the hole at a surface of the lead-frame is within a range of the surface of the lead.

(10) In the above construction (9), the lead positioned at the hole has a width wider than that of the lead elsewhere.

(11) In the above construction (1), the depth size of the hole leading from the package surface to the lead surface is smaller than the opening size of the hole at the package surface.

(12) In the above construction (1), the means for electrically connecting the semiconductor chip to the lead includes a metallic wire.

(13) In the above construction (1), the means for electrically connecting the semiconductor chip to the lead includes a bump made of an electrically conductive material.

(14) In the above construction (1), the lead includes a tape in which a metallic foil is attached to a plastic film, and the means for electrically connecting the semiconductor chip to the lead includes an automated bonding tape.

(15) In the above construction (1), the semiconductor chip is mounted on a chip pad.

(16) In the above construction (1), a circuit forming surface of the semiconductor chip is bonded to the lead via an insulating film.

(17) In the above construction (1), a surface of the semiconductor chip is opposite the surface thereof on which a circuit is formed, is bonded to the lead via an insulating film.

(18) In the above construction (15), a hole is formed extending from the package surface to the chip pad.

(19) In the above construction (18), a bump of an electrically conductive material connecting to the chip pad is provided inside of the hole and projecting outwardly from the package surface to the chip pad.

(20) In the above construction, on the package surface there is formed a projection of an enpapsulating plastic material.

(21) In the above construction (1), the lead is provided with a through hole at a portion as exposed by the hole provided in the package.

(22) In the above construction (21), a bump made of an electrically conductive material and connected to the lead is provided in the opening with respect to a part or all of the holes, this electrically conductive material being filled in the through hole.

(23) In the construction (3) or (5), the electrically conductive material is a solder.

Also, the semiconductor device according to the present invention includes a structure having a plurality of stacked semiconductor device as characterized by the following constructions:

(24) A plurality of semiconductor devices as in above construction (1) or (5) are placed one upon another and the leads of these semiconductor devices are electrically connected with one another by an electrically conductive material provided inside of the respective holes provided in the semiconductor devices.

(25) On one surface of a semiconductor device as in the above construction (1) or (15) is provided an electronic component, and the outer terminal of this electronic component and the lead of the semiconductor device are electrically connected to each other by an electrically conductive material.

(26) In the above construction (24), at least one of the semiconductor devices placed one upon another has a semiconductor chip facilitated with a computer processing function, and at least another of the semiconductor devices placed one upon another has a memory chip mounted thereon.

(27) In the above construction (25), the semiconductor device has the semiconductor chip facilitated with a computer processing function, and with the electronic part having a memory chip mounted thereon.

The semiconductor device according to the present invention is a plastic-molded-type and produced by use of die as characterized by any one of the processes listed below.

(28) The method includes forming a plurality of projections on the upper mold and on the lower mold so as to align the upper projections with the lower ones while avoiding the semiconductor chip in a cavity, with the projections putting a lead frame therebetween, and the encapsulating resin is flown into the die.

(29) In the above construction (23), the holes provided at the package surface of the semiconductor device are filled with a cream solder which is subsequently heated to form solder bumps.

The lead frame according to the present invention has any of the following features:

(30) In a lead frame including a plurality of leads and a frame for supporting these leads, a portion which is wider than elsewhere is provided at one position of each lead in part or all of the leads.

(31) In a lead frame including a plurality of leads, a chip pad on which the semiconductor chip is mounted, a pad-suspending lead for supporting the chip pad, and an outer frame for supporting them, a portion which is wider than elsewhere is provided at one position of each lead in part or all of the leads.

(32) In the above construction (30) or (31), a through hole is provided at the lead portion which is wider than elsewhere.

(33) In the above construction (30) or (31), the lead portion wider than elsewhere is surface-treated to facilitate the wetting of a solder.

(34) In the above construction (31), the spacing between the adjacent lead ends facing the chip pad has a periodicity.

A mounting board according to the present invention is a total structure in which a semiconductor device is mounted upon a substrate and has any of the following constructions:

(35) A construction in which a lead plastic-molded in the semiconductor device is directly connected to a side of a substrate thereof by an electrically conductive member, each connecting portion thereof is covered at its side surfaces with a resin, the counter substrate side (the side opposite to the substrate side) is provided with a hole which reaches to the lead at a position corresponding to the electrically conductive member.

(36) The semiconductor device as in the above construction (1), (2) or (5) is mounted on the board.

(37) In a mounting board on which the semiconductor device as in the above construction (19) is mounted, the electrically conductive material connecting to the chip pad is a solder and the semiconductor device is soldered to a wiring pattern provided on a printed circuit board.

(38) In the mounting board in which the semiconductor device as in the above construction (20) is mounted on a printed circuit board, the mounting is effected so as to make projections in contact with the printed circuit board.

A semiconductor device according to the present invention makes use in a production process thereof a die provided with projections on both package forming surfaces of an upper mold and a lower mold. Since a lead frame is put between these projections and plastic-molded, the holes at which the soldered bumps are provided can be formed with ease. Further, since the surface of a lead frame is not covered or contaminated with a resin, the soldered bumps connected to the lead frame are readily formed thereon.

DETAILED DESCRIPTION OF TEE PREFERRED EMBODIMENTS:

Hereinafter, various embodiments of the present invention will be described with reference to the accompanying drawings.

Figure 1:
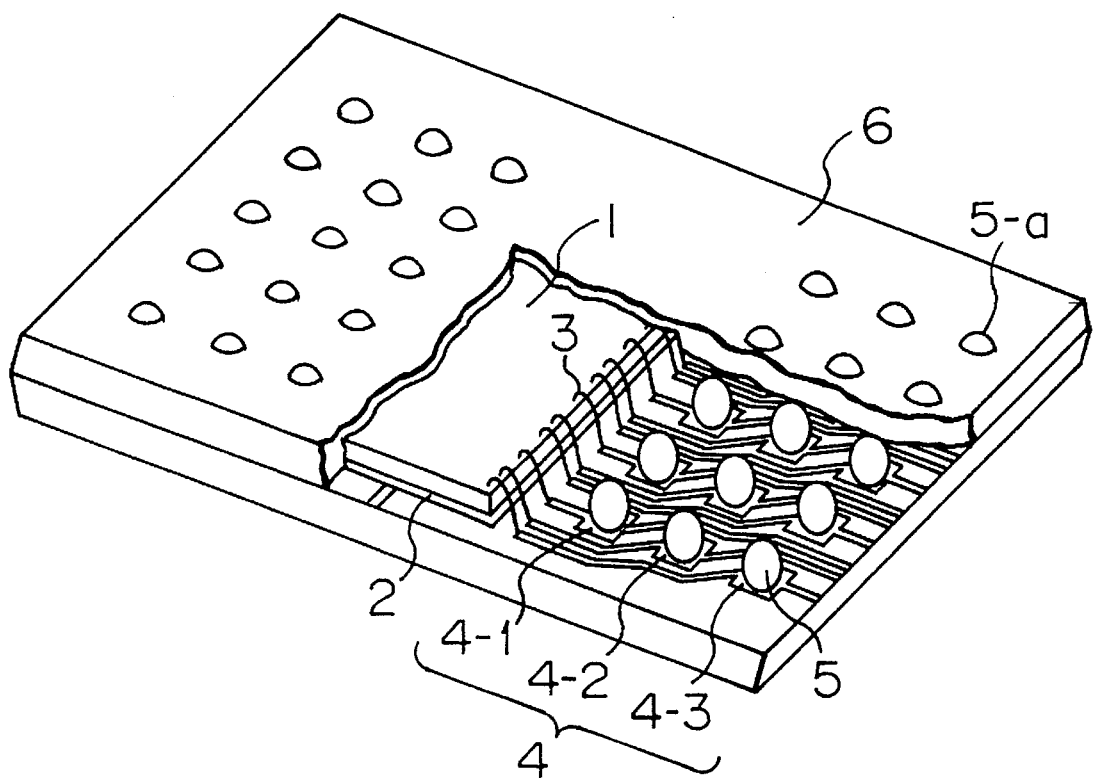
FIG. 1 is a perspective view of a semiconductor device according to a first embodiment of the present invention.

The semiconductor device according to a first embodiment of the invention is shown as a perspective view in FIG. 1. To aid the understanding of the structure, this drawing shows the device with a portion of the encapsulating resin of the package thereof removed.

A semiconductor chip 1 is mounted on a chip pad 2 made of a material which is the same as that of leads 4, and an electrode of the chip 1 and the leads 4 are electrically connected by metallic wires 3 to each other. The leads include portions 4-1, 4-2, 4-3 which are wider than elsewhere with each portion being provided for each lead. These portions will hereinafter be referred to as solder pads. Each such lead portion, which functions as a solder pad, acts to effect a partition (division) such that the pair of upper and lower holes (e.g., 7) associated therewith are completely isolated from each other.

Though not seen in the figure, an encapsulating resin 6 is provided with holes each extending from a solder pad to both surfaces of the package. Further, a solder bump 5 connected to the solder pad is provided inside of such a hole. The tip 5-a of the solder bump is shown as projecting on the package surface.

Figure 2:
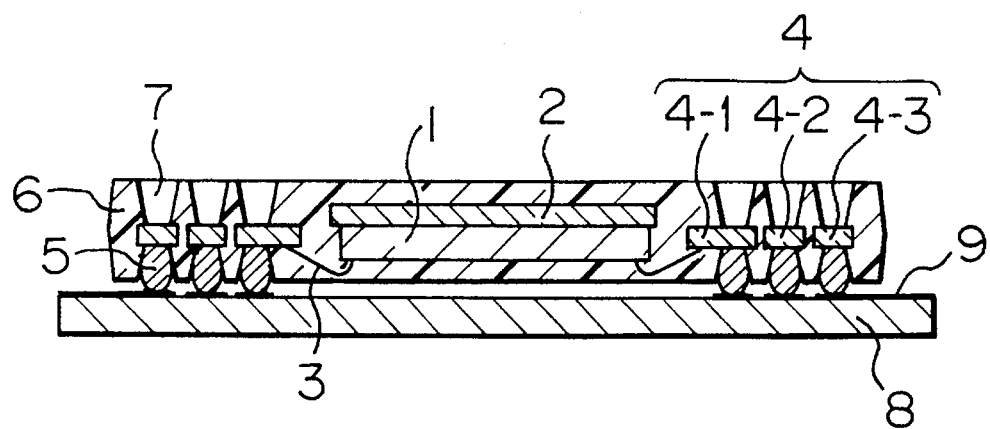
FIG. 2 is a cross-sectional view of the semiconductor device according to the first embodiment of the present invention.

FIG. 2 as a cross-sectional view shows the state in which the semiconductor device according to the first embodiment is mounted on a substrate. The solder bumps 5 connected to the solder pads 4-1, 4-2, 4-3 provided within holes 7 are connected to a wiring pattern 9 provided on a printed circuit board 8.

In this way, the semiconductor device according to the present embodiment has the chip 1 electrically connected to the wiring pattern 9 on the printed circuit board 8 via the wires 3, the leads 4 and solder bumps 5. Since these connection methods are based on presently established techniques, the reliability of the semiconductor device of the present embodiment is high.

Further, as shown in FIG. 1, since the solder bumps 5 serving as outer electrodes of the semiconductor device are arranged two-dimensionally on the package surface, they are made suitable for a multi-pin package.

Figure 3:
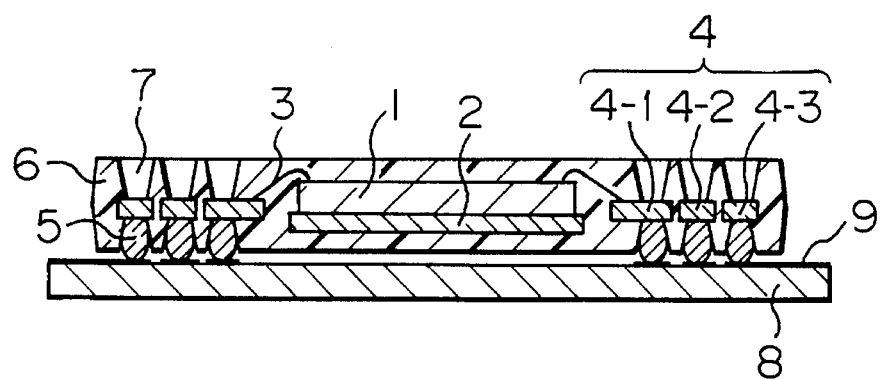
FIG. 3 is a cross-sectional view of a modification of the semiconductor device according to the first embodiment of the present invention.

While the chip 1 is provided in the same direction as that of the solder bumps 5 in the embodiment of FIGS. 1 and 2, this may be reversed as shown in FIG. 3.

Figure 4:
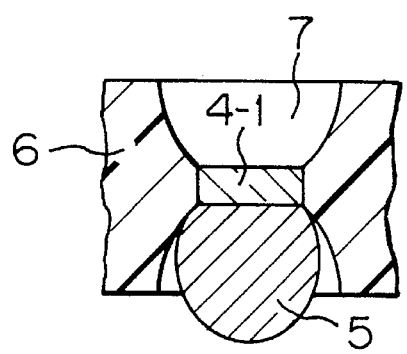
FIG. 4 is a cross-sectional view of a modified hole of the semiconductor device according to the first embodiment of the present invention.
Figure 5:
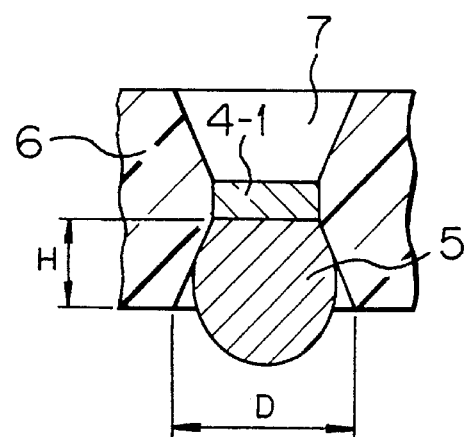
FIG. 5 is a cross-sectional view of a preferred configuration of the hole of the semiconductor device according to the first embodiment of the present invention.

Although the holes are tapered inwardly in the embodiment of FIG. 2, the configuration of each hole may be varied to be semi-spherical as shown in FIG. 4. The relationship of the opening size D (e.g., diameter and the depth H of each hole should desirably be such that the opening size D is greater than the depth H as shown in FIG. 5. In order for the solder bumps to be provided, a solder is once melted. While it must be connected to the solder pad 4-1, the solder then becomes spherical due to its surface tension. For this reason, if the opening size D is smaller than the depth H, there is a fear that the solder bump is immersed inside of the hole 7.

Figure 6:
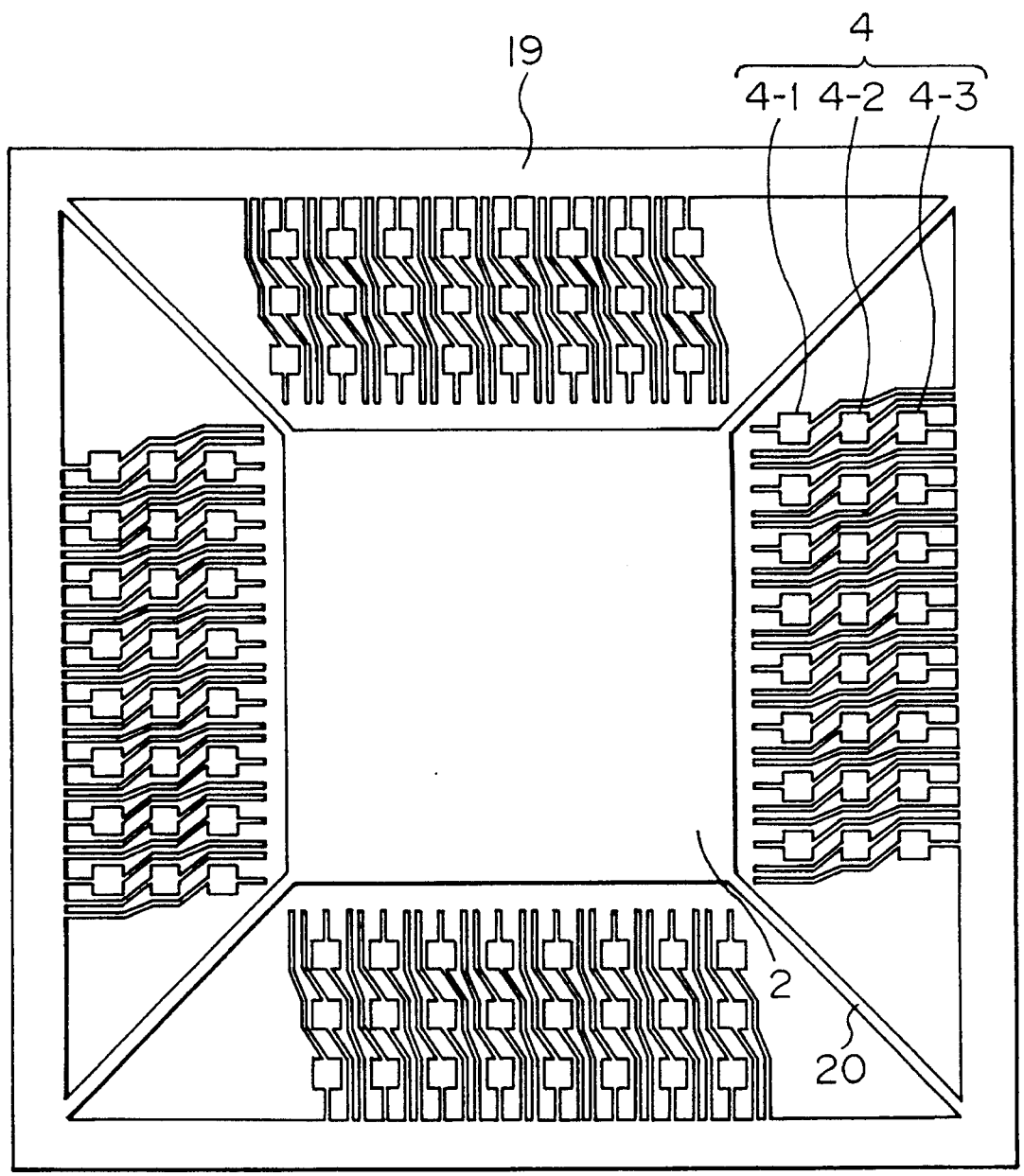
FIG. 6 is a top plan view of a lead frame according to a second embodiment of the present invention.

A lead frame according to a second embodiment of the present invention is shown in FIG. 6. The outer frame 19 of the lead frame has all leads 4 and pad-suspending leads 20 connected thereto. The chip pad 2 is connected to the outer frame 19 via the pad-suspending leads 20. Each lead has a portion 4-1 which is wider than elsewhere, and such portions as viewed from the outline of the outer frame 19 are disposed so as to form a three-step structure.

In this way, since the lead frame according to the second embodiment is provided with the portion 4-1 which is wider than elsewhere, this portion can be used as a solder pad which is connected to the solder bumps, thus providing a lead frame suitable for use with the semiconductor device of the first embodiment.

Further, the lead frame according to the present embodiment is of the same structure as the conventional lead frame except that there is provided a portion 4-1 which is wider than elsewhere. This enables the conventional technique to be used in the manufacture of this lead frame and in the production of the semiconductor device using this lead frame; hence there is no possibility of increasing the production cost or of inviting a reduction in reliability.

Since portions 4-1, ... which are wider than elsewhere make use of the solder pads, it is desirable that the surface in which soldering is accomplished is surface-treated in order to increase the wettability of a solder. Such surface treatment includes: solder-plating, tin-plating, plating with a noble metal such as gold, palladium-plating or the like.

Incidentally, the outer frame 19 is a portion which is removed after the package is formed. Also, as illustrated, it is desirable that the arrangement of lead ends on the side facing the chip pad have a periodicity (e.g., and uniformly arranged and conform to periodic pattern for each side thereof.

Figure 7:
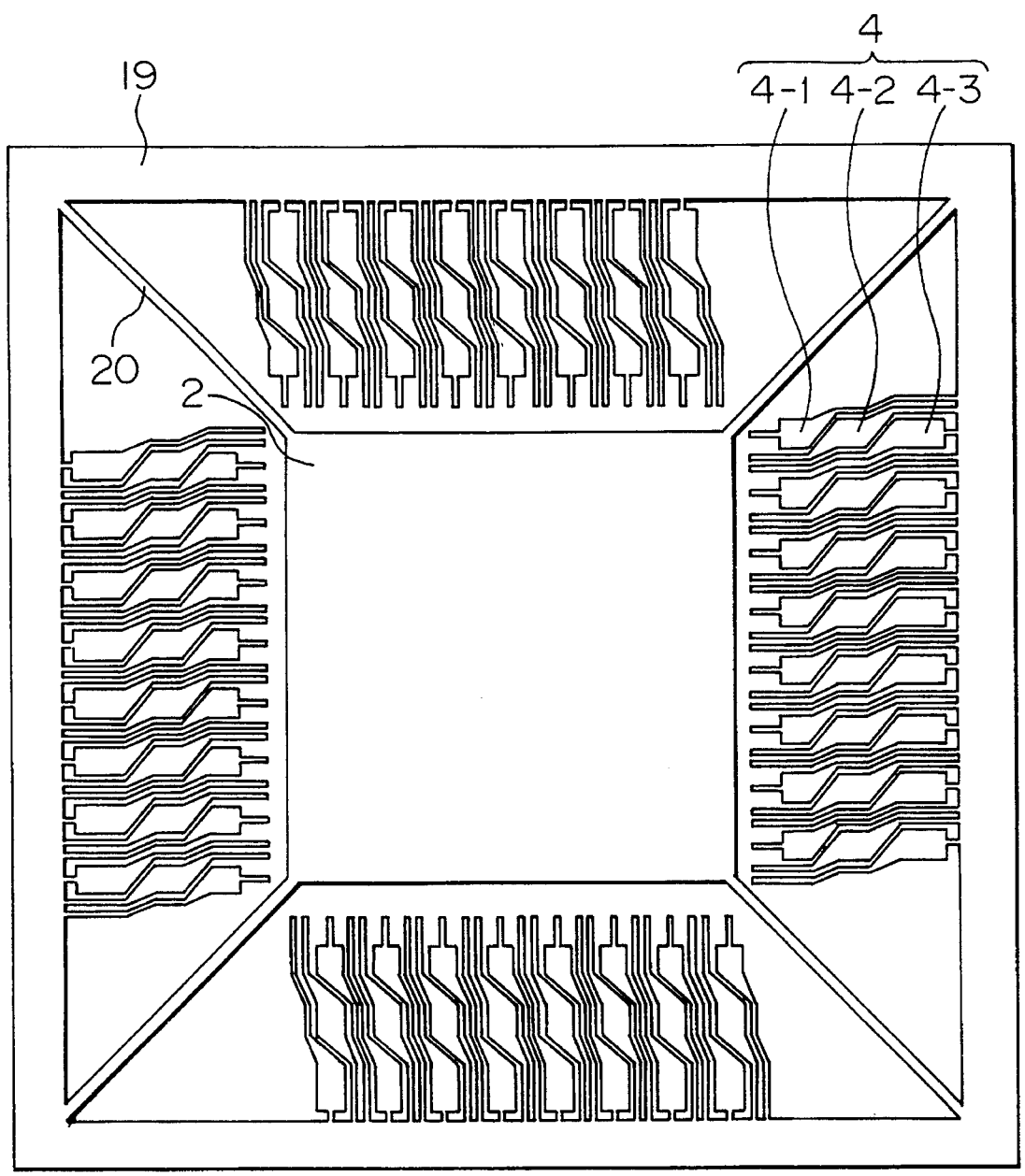
FIG. 7 is a top plan view of a lead frame according to a third embodiment of the present invention.

A lead frame according to a third embodiment of the present invention is shown in FIG. 7. In this embodiment, portions 4-1, 4-2, 4-3 which are wider than elsewhere are provided not in a rectangular form as in the second embodiment but so as to minimize the space between adjacent leads. Since the cross-sectional area of each lead is enlarged by providing a portion which is wider than elsewhere in this manner, there results an advantage that the flatness of leads is maintained.

A method of producing a semiconductor device according to a fourth embodiment of the present invention is shown in FIG. 8. In this embodiment, a semiconductor chip 1 is first mounted on a chip pad 2 of a lead frame of the second embodiment, and then the chip 1 and the leads 4 are electrically connected by metallic wires 3 to each other. The state in which this is clamped by the upper mold 10-a and the lower mold 10-b is shown in FIG. 8A.

The package forming surfaces of the upper mold 10-a and the lower mold 10-b are provided with projections 11-1, 11-2, 11-3 at portions corresponding to the portions 4-1, 4-2, 4-3 which are wider than elsewhere of leads. These wider portions of the leads are put between the projections of the upper and lower molds.

Figure 8A:
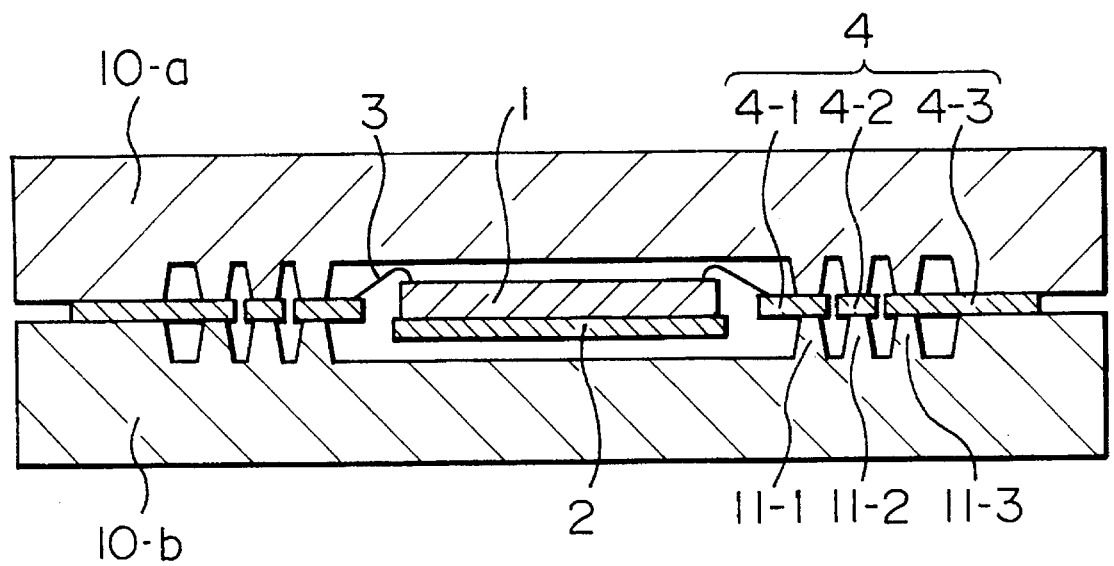
FIGS. 8A to 8D are cross-sectional views illustrating a method of producing a semiconductor device according to a fourth embodiment of the present invention.
Figure 8B:
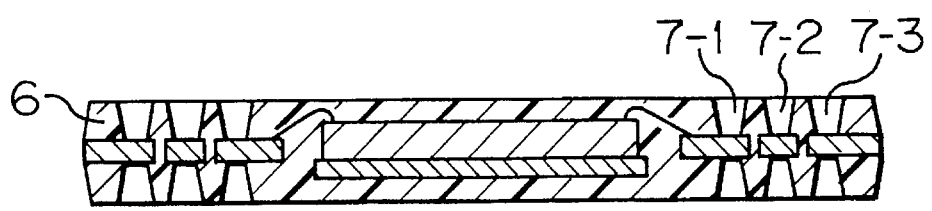

If a resin is molded in this state and unnecessary portions such as the frame of the lead frame are cut away, a semiconductor device can be provided as shown in FIG. 8B. Since the resin does not come in the projection portions of the die, holes 7-1, 7-2, 7-3, etc. are formed in the encapsulating resin 6. Yet, at the time of molding, since the ends of the projections remain attached to the end of the projection, etc., there is no possibility that they are covered or contaminated with the plastic.

If a projection is provided on only one of the molds, in a structure in which a hole is formed on one side only of the package, the end of the projection being incapable of attaching to a lead with strength, a wider portion of the lead becomes covered with a thin layer of the plastic, thus disabling a solder-bonding to be accomplished.

Figure 8C:
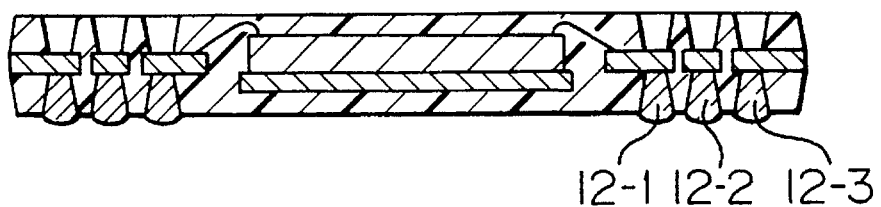
Figure 8D:
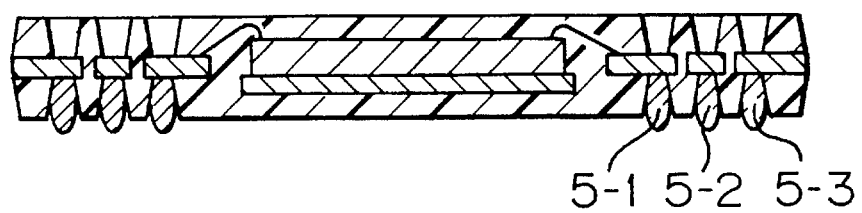

Subsequently, as shown in FIG. 8C, holes 7-1, etc., are filled with a cream solder 12-1, 12-2, 12-3 and then heated. Since the wider portions of the leads are then not contaminated with the plastic, the solder-bonding is achieved with ease and there results a semiconductor device formed with solder bumps 5-1, 5-2, 5-3 as shown in FIG. 8D. As can be seen from FIGS. 8B–8D each lead portion (e.g., 4-1, 4-2, 4-3) for forming a solder pad acts to effect a partition (division) such that the pair of upper and lower holes (e.g., 7-1, 7-2, 7-3) associated therewith are completely isolated from each other.

Figure 9:
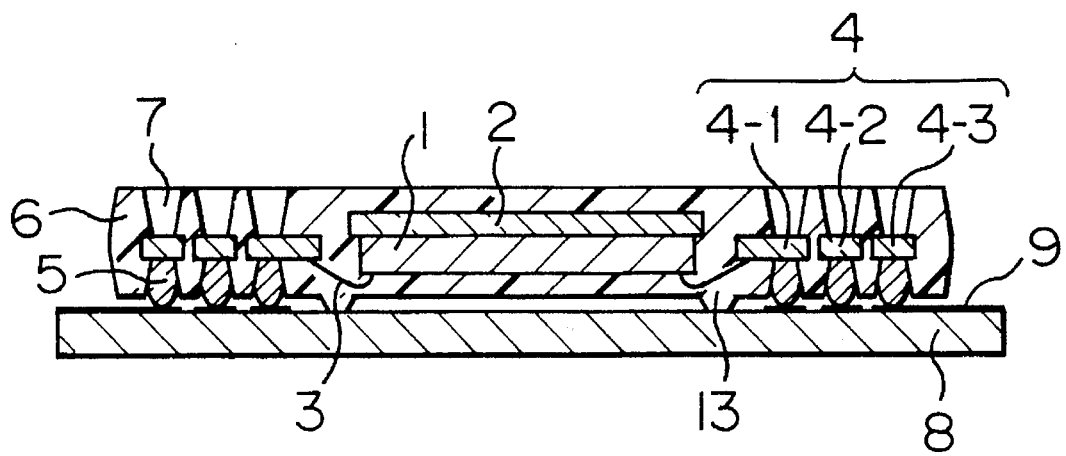
FIG. 9 is a cross-sectional view illustrating a method of producing a semiconductor device according to a fifth embodiment of the present invention.

A semiconductor device according to a fifth embodiment of the present invention which is mounted on a printed circuit board is shown in a cross-sectional view of FIG. 9. In this embodiment, the lower surface of the package is formed with a projection 13 made of a plastic. Since the spacing between the package and the board is then controlled with this projection, the reliability of the solder-bonding portion can be increased. Further, this projection can be used in positioning the package relative to the print. Incidentally, this projection can easily be formed by providing the encapsulating die with a recess.

Figure 10:
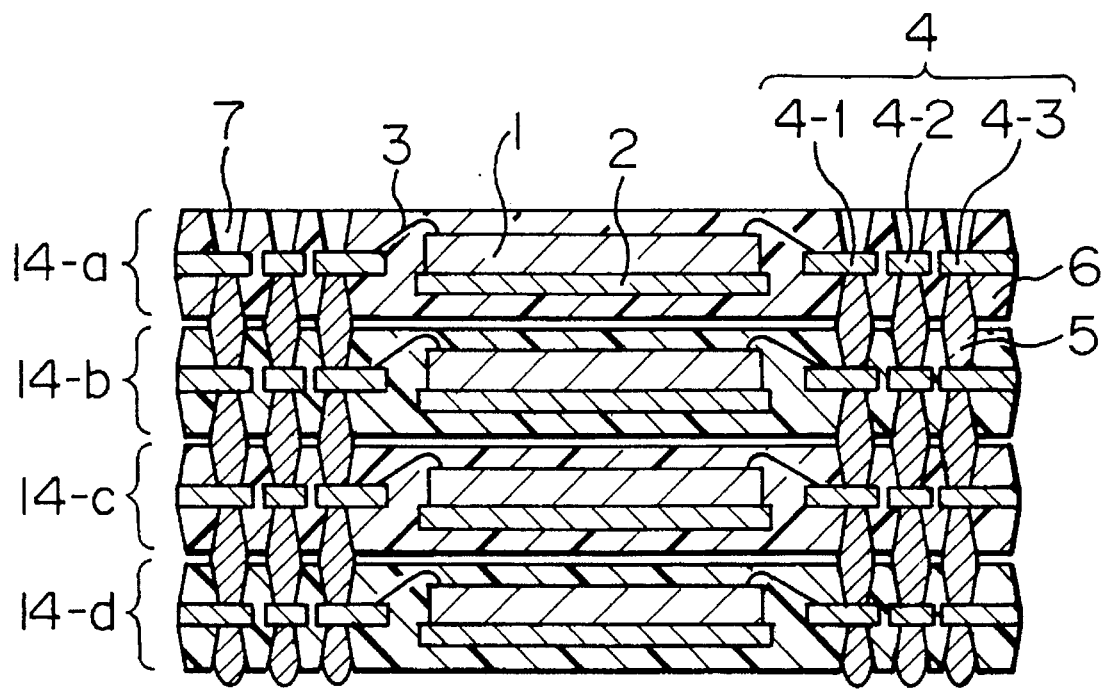
FIG. 10 is a cross-sectional view of a semiconductor device according to a sixth embodiment of the present invention.

A semiconductor apparatus according to a sixth embodiment of the present invention is shown in a cross-sectional view of FIG. 10. In this embodiment, four semiconductor devices as shown in the first embodiment are placed one upon another and the respective leads 4 are connected by way of bumps 5. By constructing the packages in this manner and mounting the lowest package 14-d upon a printed circuit board, the mounting density is increased to be quadrupled.

Figure 11:
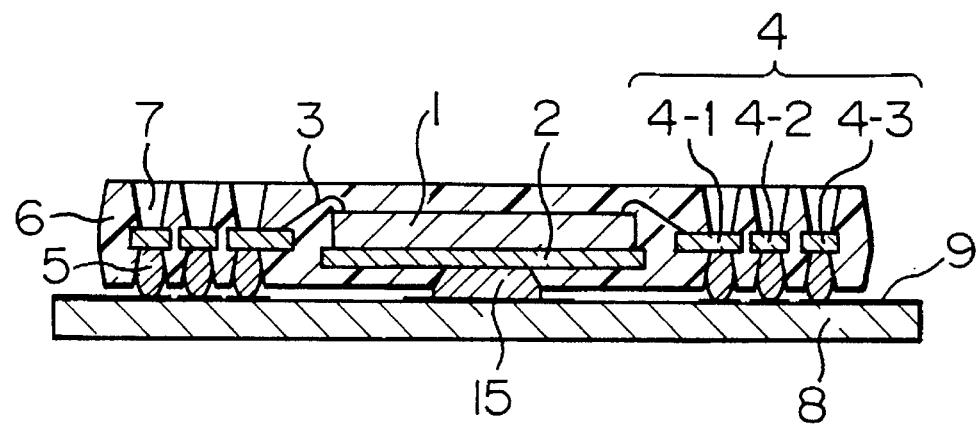
FIG. 11 is a cross-sectional view of a semiconductor device according to a seventh embodiment of the present invention.

A semiconductor device according to a seventh embodiment is shown in a cross-sectional view of FIG. 11. In this embodiment, the resin on the rear side of a chip pad 2 is formed with a hole, and the tab chip 2 and a printed circuit board 8 are connected to each other by a solder 15. By employing such a construction, since the heat generated in the chip is dispersed to the printed circuit board 8 by way of the solder 15 of high thermal conductivity, the thermal resistance of the package can be markedly reduced.

Figure 12:
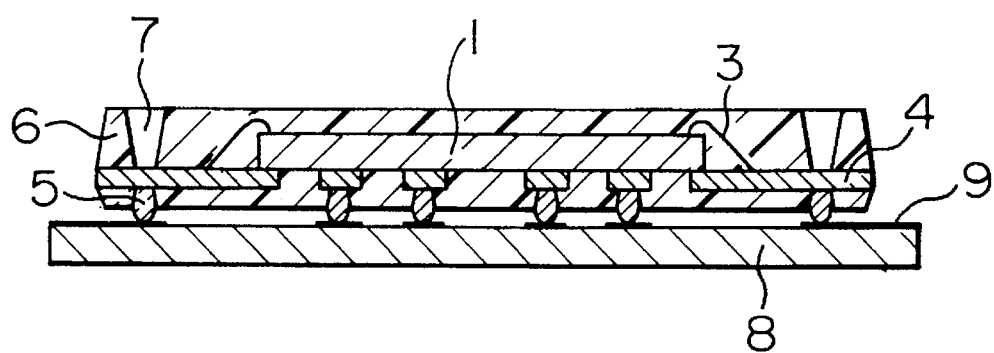
FIG. 12 is a cross-sectional view of a semiconductor device according to a eighth embodiment of the present invention.

A semiconductor device according to an eighth embodiment of the present invention is shown in a cross sectional view of FIG. 12. In this embodiment, the present invention is applied to a package of a chip-on-lead structure in which the leads 4 are bonded to the opposite side of a circuit forming surface of a chip 1 via an insulator (not shown).

Figure 13:
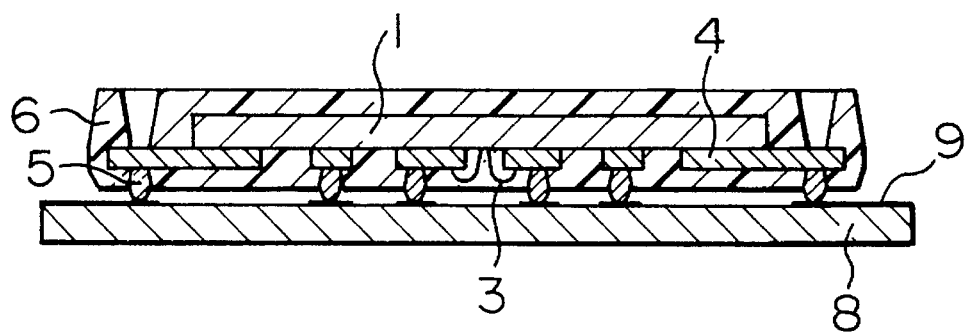
FIG. 13 is a cross-sectional view of a semiconductor device according to a ninth embodiment of the present invention.

A semiconductor device according to a ninth embodiment of the present invention is shown in a cross-sectional view of FIG. 13. In this embodiment, the present invention is applied to a package of a lead-on-chip structural package in which the leads 4 are bonded to a circuit forming surface of a chip 1 via an insulator (not shown).

Figure 14:
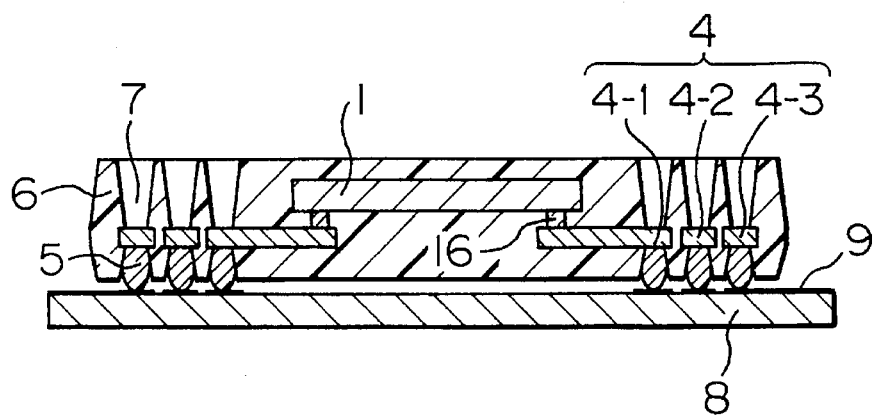
FIG. 14 is a cross-sectional view of a semiconductor device according to a tenth embodiment of the present invention.

A semiconductor device according to a tenth embodiment of the present invention is shown in a cross-sectional view of FIG. 14. In this embodiment, solder bumps 16 are used in the connection of the electrode of a chip 1 and leads 4.

Figure 15:
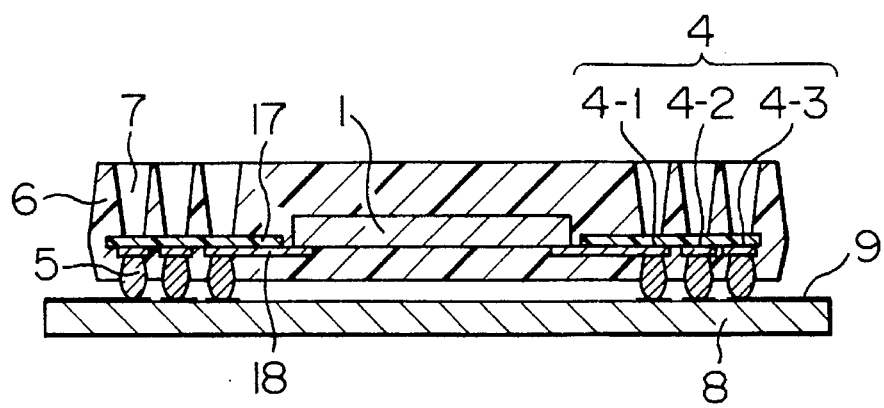
FIG. 15 is a cross-sectional view of a semiconductor device according to an eleventh embodiment of the present invention.

A semiconductor device according to an eleventh embodiment of the present invention is shown in a cross-sectional view of FIG. 15. In the embodiment, a tape in which a plastic foil is bonded to a metallic film is used as a lead. And, the means for electrically connecting a semiconductor chip and a lead frame comprises an automated bonding tape 18. By employing such a construction, the package can be made thin.

Figure 16:
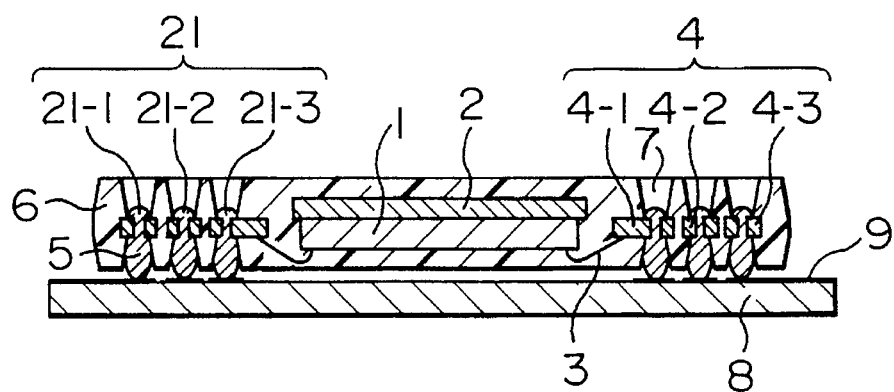
FIG. 16 is a cross-sectional view of a semiconductor device according to a twelfth embodiment of the present invention.

A semiconductor device according to a twelfth embodiment of the present invention is shown in a cross-sectional view of FIG. 16. In this embodiment, the solder pads 4 to which the solder bumps 5 are connected are formed with through holes 21.

If the connection of the solder bump 5 and the solder pad 4-1, etc., is favorable, the solder is drawn up through the through hole 21, and the solder can be viewed from the direction of the hole on the opposite side as shown in FIG. 16.

By constructing the lead frame in this manner, it is possible to check by means of a visual examination from the upper side of the package whether or not the solder bumps 5 are favorably formed. Incidentally it is possible to conduct this examination automatically by using an image processing. Further, since the solder bump 5 mechanically bites the solder pad 4, there is an additional advantage that the bond is further strengthened.

Figure 17:
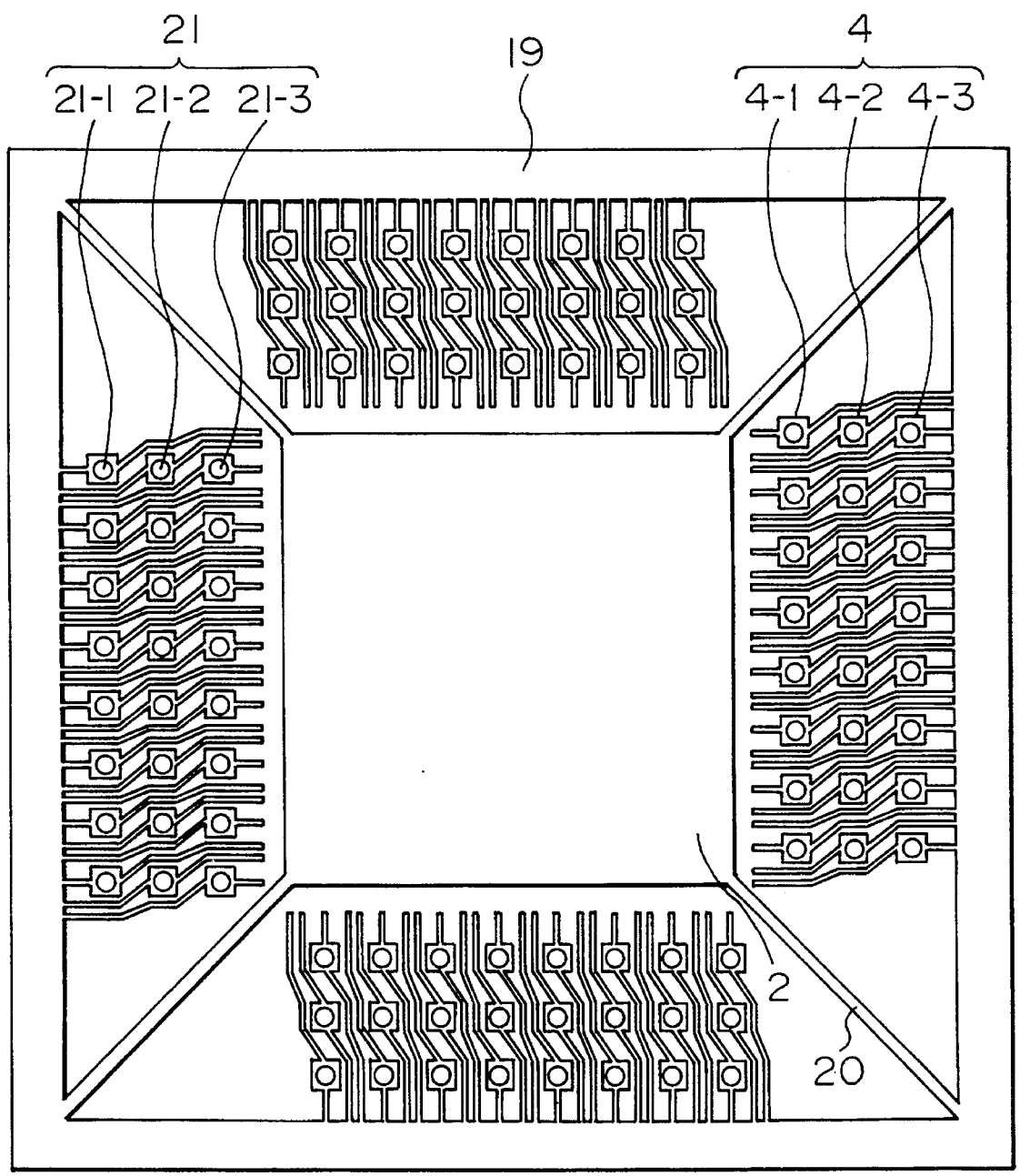
FIG. 17 is a top plan view of a lead frame according to a thirteenth embodiment of the present invention.

A lead frame according to a thirteenth embodiment of the present invention is shown in a top plan view of FIG. 17. This lead frame makes use of a semiconductor device as in the twelfth embodiment of the present invention and is provided with through holes 21 at the solder pads 4.

Figure 18:
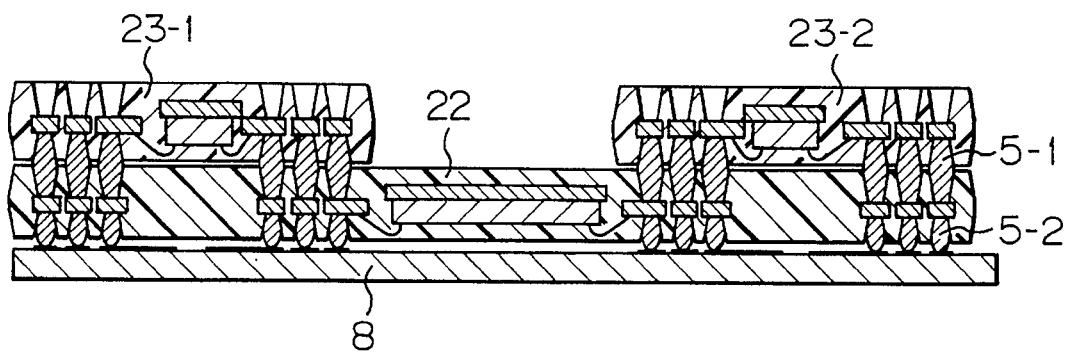
FIG. 18 is a cross-sectional view of a semiconductor device according to a fourteenth embodiment of the present invention.

A semiconductor apparatus according to a fourteenth embodiment of the present invention is shown in a cross-sectional view of FIG. 18. In this embodiment, three semiconductor devices according to the first embodiment are utilized. A semiconductor device 22 has a semiconductor chip having a computer processing function and semiconductor devices 23-1 and 23-2 provided thereon are semiconductor devices having memory chips.

These semiconductor devices are electrically connected to one another by solder bumps 5-1. Further, the semiconductor device 22 is mounted on a substrate 8 by way of bumps 5-2. By employing such a construction, a highly integrated computer can be constructed.

Figure 19:
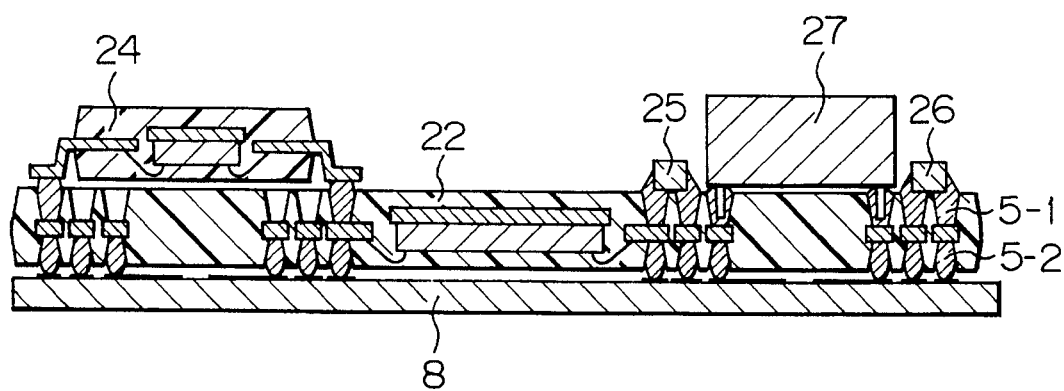
FIG. 19 is a cross-sectional view of a semiconductor apparatus according to a fifteenth embodiment of the present invention.

A semiconductor apparatus according to a fifteenth embodiment of the present invention is shown in a cross-sectional view of FIG. 19. In this embodiment, on a semiconductor device 22 according to the first embodiment there are mounted a semiconductor device 24 of conventional construction, a chip 25, a chip capacitor 26, a transformer 27 and the like, which are electrically connected to each other by solder bumps 5-1. By employing such a construction, it is possible to make semiconductor devices compact to a large extent.

In the foregoing embodiments, while solder bumps 5 are always employed, the material constituting them is not limited to a solder. Instead, it may effectively be any electrically conductive material such as a silver paste or an anisotropic conductive paste.

As described in the foregoing, the present invention provides a package which is suitable for mass production and a multi-pin structure and is excellent for reliability. Thus, it effects an advantage of achieving a high densification of electronic devices.

What is claimed is:

1. A semiconductor device, provided in a plastic encapsulated package, having a semiconductor chip, a plurality of leads and means for electrically connecting said chip and said leads to each other, said semiconductor device comprising:

first holes provided in said package which are extended from one surface of said package to a first of a pair of opposing sides of said leads provided inside of said package, respectively; and second holes provided in said package which are aligned with said first holes, respectively, in a manner such that each second hole is extended from an opposite surface of said package to a location on the second, opposing side of a corresponding lead which lead location, on the first side thereof, has extended thereto a corresponding first hole of said package, wherein the first holes and the second holes are provided as a plurality of sets of individual pairs of aligned holes each pair of holes being extended inwardly from the opposing surfaces of the package to the first and second opposing sides, at a same location, of a corresponding lead, and wherein each lead which has extended thereto a pair of aligned holes in said package acts as a main component of a partition which completely isolates the first and second holes thereof from each other.

2. A semiconductor device according to claim 1, wherein bumps made of an electrically conductive material are provided inside of part or all of said holes for connection to said leads.

3. A semiconductor device according to claim 2, wherein said electrically conductive material is a solder.

4. A semiconductor material according to claim 2, wherein said bumps which are provided inside of part or all of said holes are projected from a surface of said package.

5. A semiconductor device according to claim 1, wherein an area of an opening of each hole at a respective surface of the package is greater than the area thereof at the surface of the corresponding lead.

6. A semiconductor device according to claim 1, wherein each of said holes becomes narrower in a direction towards the inside of said package.

7. A semiconductor device according to claim 1, wherein an inside circumference of said hole at the surface of said lead is dimensioned to be within a range of the corresponding surface area of the lead.

8. A semiconductor device according to claim 7, wherein a portion of each of said leads at the location of said hole has a width which is greater than each of said leads at other portions thereof.

9. A semiconductor device according to claim 1, wherein the depth of each hole, extending from a respective package surface to the corresponding side of a respective lead, is smaller than an opening size of said hole at said package surface.

10. A semiconductor device according to claim 1, wherein said means for electrically connecting said semiconductor chip to said leads comprise metallic wires.

11. A semiconductor device according to claim 1, wherein said means for electrically connecting said semiconductor chip to said leads comprise bumps made of an electrically conductive material.

12. A semiconductor device according to claim 1, wherein said leads comprise a tape in which a metallic foil is attached to a plastic film, and that said means for electrically connecting said semiconductor chip to said leads comprise a tape-automated-bonding technique.

13. A semiconductor device according to claim 1, wherein said semiconductor chip is mounted on a chip pad.

14. A semiconductor device according to claim 1, wherein a circuit forming surface of said semiconductor chip is bonded to said leads via an insulating film.

15. A semiconductor device according to claim 1, wherein a surface of said semiconductor chip, opposite the surface thereof on which a circuit is formed, is bonded to said leads via an insulating film.

16. A semiconductor device according to claim 13, wherein holes are provided which extending from said package surface to said chip pad.

17. A semiconductor device according to claim 13, wherein a hole is provided extending from said package surface to said chip pad and a bump, connected to said chip pad, and made of an electrically conductive material, is provided inside of the hole.

18. A semiconductor device according to claim 1, wherein at least one plastic-molded projection is provided on one of the two surfaces of said package surface having said first or second holes.

19. A semiconductor apparatus comprising a plurality of such semiconductor devices according to claim 1 being placed one upon another, and the leads of the respective semiconductor devices being connected to one another by an electrically conductive material disposed in said holes provided in the respective semiconductor devices.

20. A semiconductor apparatus according to claim 19, wherein at least one of such semiconductor devices placed one upon another has a semiconductor chip having a computer processing function, and another of such semiconductor devices has a memory chip.

21. A semiconductor apparatus, comprising at one surface of the semiconductor device according to claim 1 at least one electronic component, wherein outer terminals of said at least one electronic component and corresponding ones of said leads of said semiconductor device are electrically connected to each other by an electrically conductive material.

22. A semiconductor apparatus according to claim 21, wherein said semiconductor device has a semiconductor chip having a computer processing function, and said electronic part has a memory chip.

23. A semiconductor device according to claim 9, wherein said opening size consists of an opening diameter.

24. A semiconductor device, provided in a plastic encapsulated package, including a semiconductor chip, a lead and means for electrically connecting said chip to said lead, wherein:
 a first hole is provided in said package and is extended from a first surface of said package to only a first side of said lead;
 a second hole, aligned with said first hole about a common longitudinal axis, is provided in said package and is extended from a second, opposing surface of said package to only a second, opposing side of said lead,
 said lead has first and second surface portions on the first and second sides thereof that are exposed via said first and second holes which are extended thereto, respectively;
 openings of said first and second holes are tapered in a direction towards the inside of the plastic package; and
 said lead acts as a main component of a partition which completely isolates said first and second holes from each other.

25. A semiconductor device, provided in a plastic encapsulated package, including a semiconductor chip, at least one lead and means for electrically connecting said chip to said lead, wherein:
 a hole is provided in said package and is extended from a first surface of said package to only a first side of said at least one lead;
 a second hole, aligned with said first hole about a common longitudinal axis, is provided in said package and is extended from a second, opposing surface of said package to only a second, opposing side of said at least one lead,
 each lead of said at least one lead consists of an inner lead embedded in the plastic package in which first and second surface portions on the first and second, opposing sides of said inner lead are exposed via said first and second holes which are extended thereto, respectively;
 said inner lead acts as a main component of a partition which completely isolates said first and second holes from each other; and
 at least one electrically conductive member is provided each of which has one end connected to one of the first and second surface portions of said inner lead thereof and another end protruding outwardly from a corresponding one of the first and second surfaces of the plastic package.

26. A semiconductor device according to claim 24, wherein said at least one electrically conductive member consists of plural electrically conductive members for connection to a plurality of leads, respectively, said electrically conductive members protruding outwardly from a respective surface of the plastic package and being dispersed, with respect to a plan view of said respective surface, in a two-dimensional arrangement.

27. A semiconductor device according to claim 26, wherein each electrically conductive member is a solder.

28. A semiconductor device according to claim 25, wherein each electrically conductive member is a solder.

29. A semiconductor device according to claim 25, wherein openings of said first and second holes are tapered in a direction towards the inside of the plastic package.

30. A semiconductor device according to claim 29, wherein each electrically conductive member is a solder.

31. A semiconductor device, provided in a plastic encapsulated package, including a semiconductor chip, a lead and means for electrically connecting said chip to said lead, wherein:
 said package has embedded therein said lead which acts as a partition in a manner in which a penetrating hole extending from a first surface of said package to a second, opposing surface thereof is divided into first and second holes isolated completely from each other; and
 said lead has first and second surface portions on the first and second sides thereof that are exposed via said first and second holes which are extended thereto, respectively.

32. A semiconductor device according to claim 31, wherein openings of said first and second holes are tapered in a direction towards the inside of the plastic package.

33. A semiconductor device according to claim 32, wherein a solder bump contacting one of said first and second surface portions of said lead is provided in a corresponding one of said first and second holes.

34. A lead frame comprising a plurality of leads, included in a plastic package of a semiconductor device, and an outer frame for supporting said leads, wherein:
 one or more of said plurality of leads includes a portion, within the plastic package, which is disposed as an external electrical connection pad of the encapsulated semiconductor device and which has a surface width thereof greater than the remaining part of said lead; and
 each said portion disposed as an external connection pad acts as a main component of a partition in a manner in which a pair of first and second, opposing holes in the plastic package, extending inwardly thereto from a pair of opposing surfaces thereof and aligned with one another about a common longitudinal axis, become completely isolated from each other.

35. A lead frame according to claim 34, wherein each said portion, to be used as an external connection pad of the encapsulated semiconductor device, is substantially rectangular-shaped.

36. A lead frame according to claim 35, wherein the rectangular-shaped portions of said leads are disposed in a manner in which a two-dimensional array of such portions is effected.

37. A lead frame according to claim 34, wherein the portions of said leads, used as external connection pads of the encapsulated semiconductor device are disposed in a manner in which a two-dimensional array of such portions is effected.

38. A lead frame according to claim 37, wherein front and rear facings of said portions of said leads, to be used as external connection pads, are surface-treated for enhancing the wettability of solder to be provided thereon.

39. A lead frame according to claim 34, wherein front and rear facings of the portions of said leads used as external connection pads are surface-treated for enhancing the wettability of solder to be provided thereon.

40. A lead frame including a plurality of leads, included in a package of a plastic encapsulated semiconductor device, a chip pad for mounting a semiconductor chip of the device thereon, pad-suspending leads for supporting said chip pad and an outer frame for supporting said leads, said chip pad and said pad-suspending leads, wherein:

one or more of said plurality of leads includes a portion, within the plastic package, which is disposed as an external electrical connection pad of the encapsulated semiconductor device and which has a surface width thereof greater than the remaining part of said lead; and each said portion disposed as an external connection pad acts as a main component of a partition in a manner in which a pair of first and second, opposing holes in the plastic package, extending inwardly thereto from a pair of opposing surfaces thereof and aligned with one another about a common longitudinal axis, become completely isolated from each other.

41. A lead frame according to claim 40, wherein front and rear facings of the portions of said leads used as external connection pads are surface-treated for enhancing the wettability of solder to be provided thereon.

42. A lead frame according to claim 41, wherein said portions of said leads used as external connection pads of the encapsulated semiconductor device, are disposed in a manner in which a two-dimensional array of such portions is effected.

43. A lead frame according to claim 40, wherein the portions of said leads, used as external connection pads of the encapsulated semiconductor device are disposed in a manner in which a two-dimensional array of such portions is effected.

44. A lead frame according to claim 40, wherein said plurality of leads are distributed as one or more groups of leads in which each group of leads is dispersed adjacent the length of a peripheral edge of said chip pad such that spacings between adjacent leads are arranged to conform to a periodic pattern.

45. A semiconductor device according to claim 1, which is mounted on a substrate board via electrically conductive members.

46. A semiconductor device according to claim 45, wherein said electrically conductive members consist of solder bumps.

47. A semiconductor device according to claim 2, which is mounted on a wiring substrate board via said bumps.

48. A semiconductor device according to claim 24, which is mounted on a substrate board via electrically conductive members.

49. A semiconductor device according to claim 48, wherein said electrically conductive members consist of solder bumps.

50. A mounting board for mounting the semiconductor device according to claim 17 on a printed circuit board, wherein said bump made of said electrically conductive material and connected to said chip pad is a solder, and wherein said semiconductor device is soldered to a wiring pattern provided on said printed circuit board.

51. A mounting board for mounting the semiconductor device according to claim 18 on a printed circuit board, wherein said semiconductor device via said at least one plastic-molded projection is mounted on said printed circuit board.

52. A mounting board according to claim 51, wherein said semiconductor device is electrically connected to wirings provided on said printed circuit board via solder bumps provided in said first or second holes of the plastic package.

53. A mounting board for mounting the semiconductor device according to claim 1 on a substrate board, wherein said semiconductor device is electrically connected to wirings provided on said substrate board via electrically conductive members, provided in said first or second holes of the plastic package, which are contacting said leads, respectively.

54. A mounting board according to claim 53, wherein said electrical conductive members are solder bumps.

* * * * *